United States Patent
Kamarehi et al.

(10) Patent No.: US 7,554,053 B2
(45) Date of Patent: *Jun. 30, 2009

(54) CORRUGATED PLASMA TRAP ARRANGEMENT FOR CREATING A HIGHLY EFFICIENT DOWNSTREAM MICROWAVE PLASMA SYSTEM

(75) Inventors: Mohammad Kamarehi, Gaithersburg, MD (US); Ing-Yann Albert Wang, Moraga, CA (US)

(73) Assignee: Lam Research Corporation, Fremont, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 11/317,874

(22) Filed: Dec. 23, 2005

(65) Prior Publication Data

US 2007/0145020 A1   Jun. 28, 2007

(51) Int. Cl.
*C23C 16/00* (2006.01)
*H05H 1/00* (2006.01)
*H05B 6/76* (2006.01)

(52) U.S. Cl. .............. 219/121.41; 219/699; 219/742; 118/723 ME; 118/723 MR; 118/723 MW; 156/345.35

(58) Field of Classification Search ......... 118/723 MW, 118/723 ME, 723 MR; 156/345.35, 345.36, 156/345.41; 219/695, 696, 746, 121.4, 121.41, 219/741–743, 699
See application file for complete search history.

(56) References Cited

U.S. PATENT DOCUMENTS

| 2,627,571 | A | * | 2/1953 | Heihle et al. ............... 219/699 |
| 2,747,184 | A | * | 5/1956 | Kock .......................... 343/909 |
| 2,772,402 | A | * | 11/1956 | Kiyo .......................... 333/248 |
| 3,643,054 | A | * | 2/1972 | Forster ....................... 219/699 |
| 4,132,613 | A |   | 1/1979 | Penfold et al. |

(Continued)

FOREIGN PATENT DOCUMENTS

JP          52003744 A   *   1/1977

OTHER PUBLICATIONS

Soto et al.; Analysis, Design and Experimental Verification of Microwave Filters for Safety Issues in Open-Ended Waveguide Systems; Nov. 2000; IEEE Transactions on Microwave Theory and Techniques; vol. 48, No. 11; pp. 2133-2140.*

(Continued)

*Primary Examiner*—Tu B Hoang
*Assistant Examiner*—Stephen J Ralis
(74) *Attorney, Agent, or Firm*—IP Strategy Group, P.C.

(57) ABSTRACT

A plasma system is disclosed. The plasma system includes a microwave waveguide assembly having a longitudinal axis parallel with a first axis. The plasma system also includes a plasma tube assembly intersecting the microwave waveguide assembly. The plasma tube assembly has a longitudinal axis parallel with a second axis that is substantially orthogonal with the first axis. The plasma tube assembly also has a plasma-sustaining region defined by an upstream plurality of plasma traps and a downstream plurality of plasma traps.

52 Claims, 9 Drawing Sheets

U.S. PATENT DOCUMENTS

| | | | |
|---|---|---|---|
| 4,270,999 | A | 6/1981 | Hassan et al. |
| 4,313,044 | A * | 1/1982 | Staats .......................... 219/742 |
| 4,319,856 | A | 3/1982 | Jeppson |
| 4,634,914 | A | 1/1987 | Ballato |
| 4,861,955 | A * | 8/1989 | Shen .......................... 219/699 |
| 5,082,517 | A | 1/1992 | Moslehi |
| 5,134,965 | A | 8/1992 | Tokuda et al. |
| 5,498,308 | A | 3/1996 | Kamarehi et al. |
| 5,569,363 | A | 10/1996 | Bayer et al. |
| 5,783,023 | A | 7/1998 | Oh et al. |
| 5,846,330 | A | 12/1998 | Quirk et al. |
| 5,917,389 | A * | 6/1999 | Moeller et al. .............. 333/252 |
| 5,961,851 | A | 10/1999 | Kamarehi et al. |
| 5,996,528 | A | 12/1999 | Berrian et al. |
| 6,210,458 | B1 | 4/2001 | Shindo et al. |
| 6,230,651 | B1 | 5/2001 | Ni et al. |
| 6,263,830 | B1 * | 7/2001 | Kamarehi et al. ... 118/723 MW |
| 6,352,050 | B2 * | 3/2002 | Kamarehi et al. ..... 118/723 ME |
| 6,401,653 | B1 | 6/2002 | Taniguchi et al. |
| 6,412,438 | B2 * | 7/2002 | Kamarehi et al. ..... 118/723 ME |
| 6,439,155 | B1 * | 8/2002 | Kamarehi et al. ..... 118/723 ME |
| 6,603,269 | B1 | 8/2003 | Vo et al. |
| 6,652,711 | B2 | 11/2003 | Brcka et al. |
| 2001/0020616 | A1 * | 9/2001 | Drozd et al. ................. 219/695 |
| 2002/0007912 | A1 * | 1/2002 | Kamarehi et al. ........... 156/345 |
| 2002/0011214 | A1 * | 1/2002 | Kamarehi et al. ..... 118/723 ME |
| 2002/0011310 | A1 * | 1/2002 | Kamarehi et al. ........... 156/345 |
| 2002/0023589 | A1 | 2/2002 | Kondo et al. |
| 2002/0050323 | A1 | 5/2002 | Moisan et al. |
| 2002/0112819 | A1 * | 8/2002 | Kamarehi et al. ...... 156/345.36 |
| 2002/0125225 | A1 | 9/2002 | Smith et al. |
| 2003/0192645 | A1 | 10/2003 | Liu et al. |
| 2004/0182834 | A1 | 9/2004 | Kamarehi |
| 2005/0238817 | A1 * | 10/2005 | Ho .......................... 427/569 |
| 2007/0144441 | A1 | 6/2007 | Kamarehi et al. |
| 2007/0145021 | A1 | 6/2007 | Wang et al. |

OTHER PUBLICATIONS

U.S. Appl. No. 11/317,517, filed Dec. 23, 2005; Inventors; Wang, et al.

U.S. Appl. No. 11/318,360, filed Dec. 23, 2005; Inventors; Kamarehi, et al.

U.S. Appl. No. 11/317,961, filed Dec. 23, 2005; Inventors; Wang et al.

"Notice of Office Action," mailed Dec. 12, 2006, for U.S. Appl. No. 11/317,961, filed Dec. 23, 2005; Inventors; Wang et al.

"Notice of Office Action," mailed Dec. 12, 2006, for U.S. Appl. No. 11/317,517, filed Dec. 23, 2005; Inventors; Wang et al.

U.S. Appl. No. 11/317,517, filed Dec. 23, 2005, Ralis et al.

"International Search Report", Issued in PCT Application No. PCT/US06/62446; Mailing Date: Nov. 15, 2007.

"Written Opinion", Issued in PCT Application No. PCT/US06/62446; Mailing Date: Nov. 15, 2007.

"International Preliminary Report on Pantentabiliy", Issued in PCT Application No. PCT/US2006/062446; Mailing Date: Jul. 3, 2008.

"International Search Report", Issued in PCT Application No. PCT/US06/62445; Mailing Date: Aug. 28, 2008.

"Written Opinion", Issued in PCT Application No. PCT/US06/62445; Mailing Date: Aug. 28, 2008.

"International Preliminary Report on Patentability", Issued in PCT Application No. PCT/US2006/062445; Mailing Date: Oct. 16, 2008.

"International Search Report", Issue in PCT Application No. PCT/US06/62447; Mailing Date: Mar. 27, 2008.

"Written Opinion", Issued in PCT Application No. PCT/US06/62447; Mailing Date: Mar. 27, 2008.

"International Preliminary Report on Patentability", Issued In PCT Application No. PCT/US2006/062447; Mailing Date: Jul. 31, 2008.

"Final Office Action", U.S. Appl. No. 11/317,961, Mailing Date: Jul. 2, 2007.

"Non Final Office Action", U.S. Appl. No. 11/317,961, Mailing Date: Mar. 18, 2008.

"Final Office Action", U.S. Appl. No. 11/317,961, Mailing Date: Oct. 16, 2008.

"Final Office Action", U.S. Appl. No. 11/317,517, Mailing Date: Jul. 2, 2007.

"Non Final Office Action", U.S. Appl. No. 11/317,517, Mailing Date: Dec. 19, 2007.

"Final Office Action", U.S. Appl. No. 11/317,517, Mailing Date: Jun. 26, 2008.

"Non Final Office Action", U.S. Appl. No. 11/318,360, Mailing Date: Mar. 20, 2008.

"Non Final Office Action", U.S. Appl. No. 11/318,360, Mailing Date: Aug. 20, 2008.

* cited by examiner

CORRUGATED PLASMA TRAP ARRANGEMENT FOR CREATING A HIGHLY EFFICIENT DOWNSTREAM MICROWAVE PLASMA SYSTEM

CROSS-REFERENCE TO RELATED APPLICATIONS

This application contains subject matter that is related to the subject matter of the following applications, which are assigned to the same assignee as this application. The below-listed applications are hereby incorporated herein by reference:

"Methods and Arrangement for Implementing Highly Efficient Plasma Traps," by Kamarehi et al., application Ser. No. 11/318,360 filed on even date herewith.

"Plasma Shield Arrangement for O-rings," by Wang et al., application Ser. No. 11/317,517 filed on even date herewith.

"Methods and Arrangement for a Highly Efficient Gas Distribution Arrangement," by Wang et al., application Ser. No. 11/317,961 filed on even date herewith.

BACKGROUND OF THE INVENTION

Advances in plasma processing have provided for the growth in the semiconductor industry. As the semiconductor industry has grown, microwave has been utilized as a power source for strip and non-critical etch applications in substrate processing. Strip applications include, but are not limited to, removing bulk photoresist, post metal etch strip, passivation for corrosion control, post silicon etch strip, post ion implant strip, post poly strip, and post dielectric strip.

One development that has shown continuing promise is the use of new and different geometries in plasma processing machines. Different geometries, such as long straight plasma tube and convoluted plasma tube, have been utilized in an attempt to efficiently absorb microwave power or convert absorbed microwave power into useful plasma species. To facilitate discussion, FIG. 1 shows a simple diagram of a prior art convoluted plasma tube assembly. Plasma 112 may be formed within a plasma tube 102 through the coupling of one or more gases (e.g., $O_2$, $N_2$, $N_2H_2$, $HeH_2$, water vapor, and fluorinated compounds) with microwave power, which may have been transmitted by a microwave power generator 106 through a waveguide 108. Those skilled in the arts are aware that conventional plasma tube of one inch or less in diameter may lose significant percentage of the microwave power that may be generated due to thermal loading. Since plasma 112 may include both harmful plasma species and useful plasma species, shape and dimension of plasma tubes may be manipulated to allow for harmful species to recombine into useful species. Consequently, different geometries may translate into higher efficiency apparatuses.

Consider the situation wherein, for example, plasma 112 travels through plasma tube 102 and encounters a bend 116. As plasma 112 interacts with walls of plasma tube 102 at bend 116, some of the plasma species may recombine. However, with a convoluted plasma tube, the chance for neutral species to recombine may have also increased. As a result, the more convoluted a plasma tube, the less efficient the plasma tube may be in delivering neutral species to a plasma processing chamber.

To reduce the number of useful plasma species from recombining, some manufacturers may use straight plasma tubes. Without a bend, the recombination rate of plasma species within plasma tube may be reduced. However, manufacturers may have to extend the plasma tube to minimize the possibility of harmful plasma species from reaching the plasma processing chamber.

Although geometries of plasma tubes may provide a partial solution for delivering useful plasma species to plasma processing chamber, what are needed are methods and arrangement for creating a highly efficient downstream microwave plasma system.

SUMMARY OF INVENTION

The invention relates, in an embodiment, a plasma generation arrangement configured to provide plasma downstream to a plasma processing chamber. The arrangement includes a microwave waveguide assembly having a longitudinal axis parallel with a first axis. The arrangement also includes a plasma tube assembly intersecting the microwave waveguide assembly. The plasma tube assembly has a longitudinal axis parallel with a second axis that is substantially orthogonal with the first axis. The plasma tube assembly also has a plasma-sustaining region defined by an upstream plurality of plasma traps and a downstream plurality of plasma traps.

In another embodiment, the invention relates to a plasma generation arrangement configured to provide plasma downstream to a plasma processing chamber. The arrangement includes a microwave waveguide assembly having a longitudinal axis parallel with a first axis. The arrangement also includes a plasma tube assembly intersecting the microwave waveguide assembly. The plasma tube assembly has a longitudinal axis parallel with a second axis that is substantially orthogonal with the first axis. The plasma tube assembly also has a plasma-sustaining region defined by an upstream plasma trap set and downstream plasma trap set disposed downstream relative to the upstream plasma traps. The plasma tube assembly further includes a downstream cooling manifold. The downstream cooling manifold is disposed in one of a first assembly arrangement and a second assembly arrangement relative to the downstream plasma trap set. The first assembly arrangement is characterized by having substantially no air gap between an upstream-facing surface of the downstream cooling manifold and a downstream-facing surface of the downstream plasma trap set. The second assembly arrangement is characterized by the downstream cooling manifold being disposed adjacent to the downstream plasma trap set.

In yet another embodiment, the invention relates to a plasma generation arrangement configured to provide plasma downstream to a plasma processing chamber. The arrangement includes a microwave waveguide assembly having a longitudinal axis parallel with a first axis. The arrangement also includes a plasma tube assembly intersecting the microwave waveguide assembly. The plasma tube assembly has a longitudinal axis parallel with a second axis that is substantially orthogonal with the first axis. The plasma tube assembly also has a plasma-sustaining region defined by an upstream plurality of plasma traps and a downstream plurality of plasma traps. The downstream plurality of plasma traps includes at least a downstream outer plasma trap and a downstream inner plasma trap. The downstream outer plasma trap is disposed downstream relative to the downstream inner plasma trap. The arrangement further includes a downstream cooling manifold disposed in one of a first assembly arrangement and a second assembly arrangement relative to the downstream outer plasma trap. The first assembly arrangement is characterized by having substantially no air gap between an upstream-facing surface of the downstream cooling manifold and a downstream-facing surface of the downstream outer plasma trap. The second assembly arrangement is characterized by the downstream cooling manifold being disposed adjacent to the downstream outer plasma trap.

These and other features of the present invention will be described in more detail below in the detailed description of the invention and in conjunction with the following figures.

BRIEF DESCRIPTION OF THE DRAWINGS

The present invention is illustrated by way of example, and not by way of limitation, in the figures of the accompanying drawings and in which like reference numerals refer to similar elements and in which.

DETAILED DESCRIPTION OF VARIOUS EMBODIMENTS

The present invention will now be described in detail with reference to various embodiments thereof as illustrated in the accompanying drawings. In the following description, numerous specific details are set forth in order to provide a thorough understanding of the present invention. It will be apparent, however, to one skilled in the art, that the present invention may be practiced without some or all of these specific details. In other instances, well known process steps and/or structures have not been described in detail in order to not unnecessarily obscure the present invention.

In accordance with embodiments of the present invention, there is provided a plasma generation arrangement within a downstream microwave plasma system. The plasma generation arrangement may be configured to generate plasma and channel a portion of the plasma downstream to a plasma processing chamber. In some embodiments, the plasma generation arrangement may have a low profile configuration to enable a more efficient delivery of useful plasma species to the plasma processing chamber.

Figure 1:
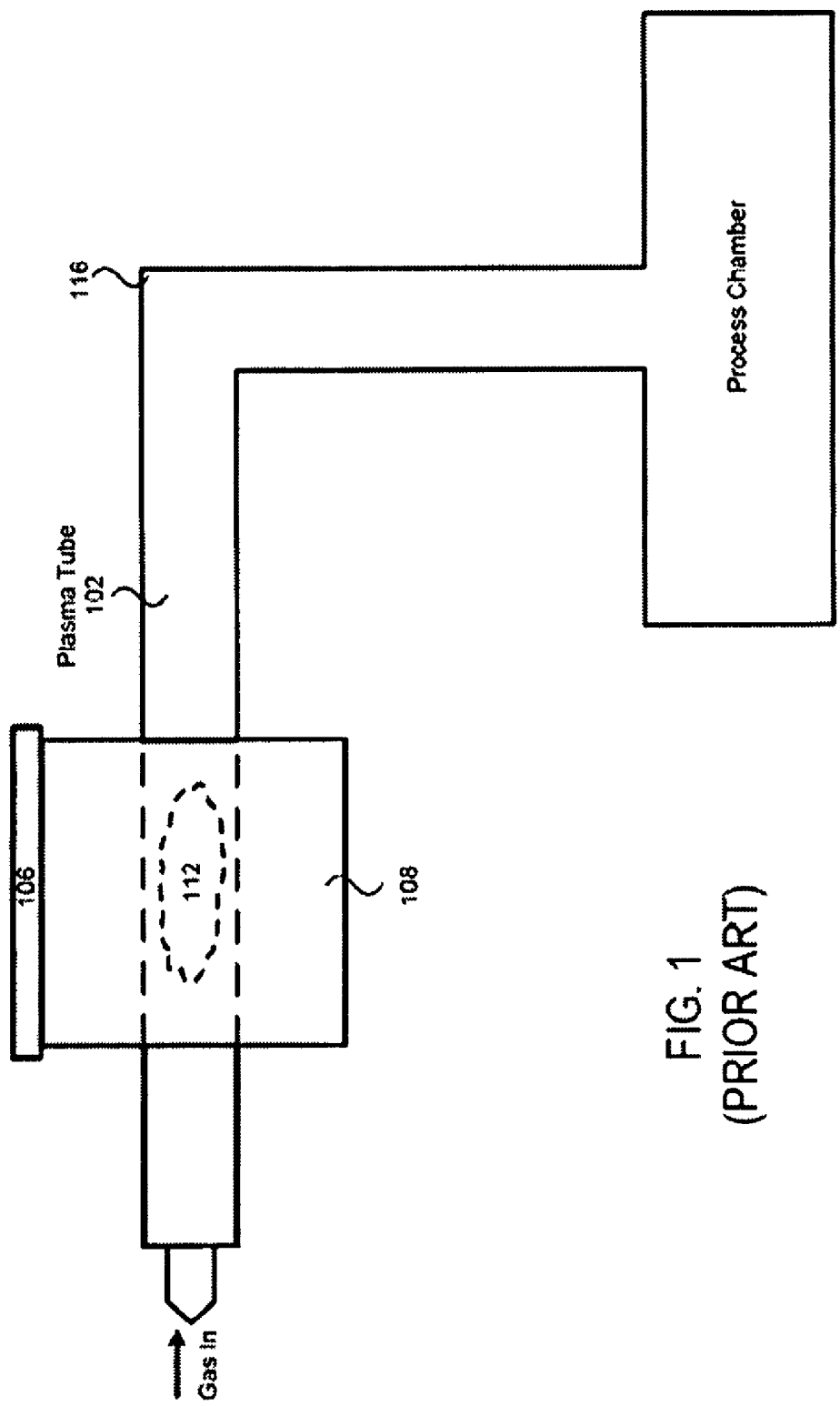
FIG. 1 shows a simple diagram of a prior art convoluted plasma tube assembly.
Figure 2:
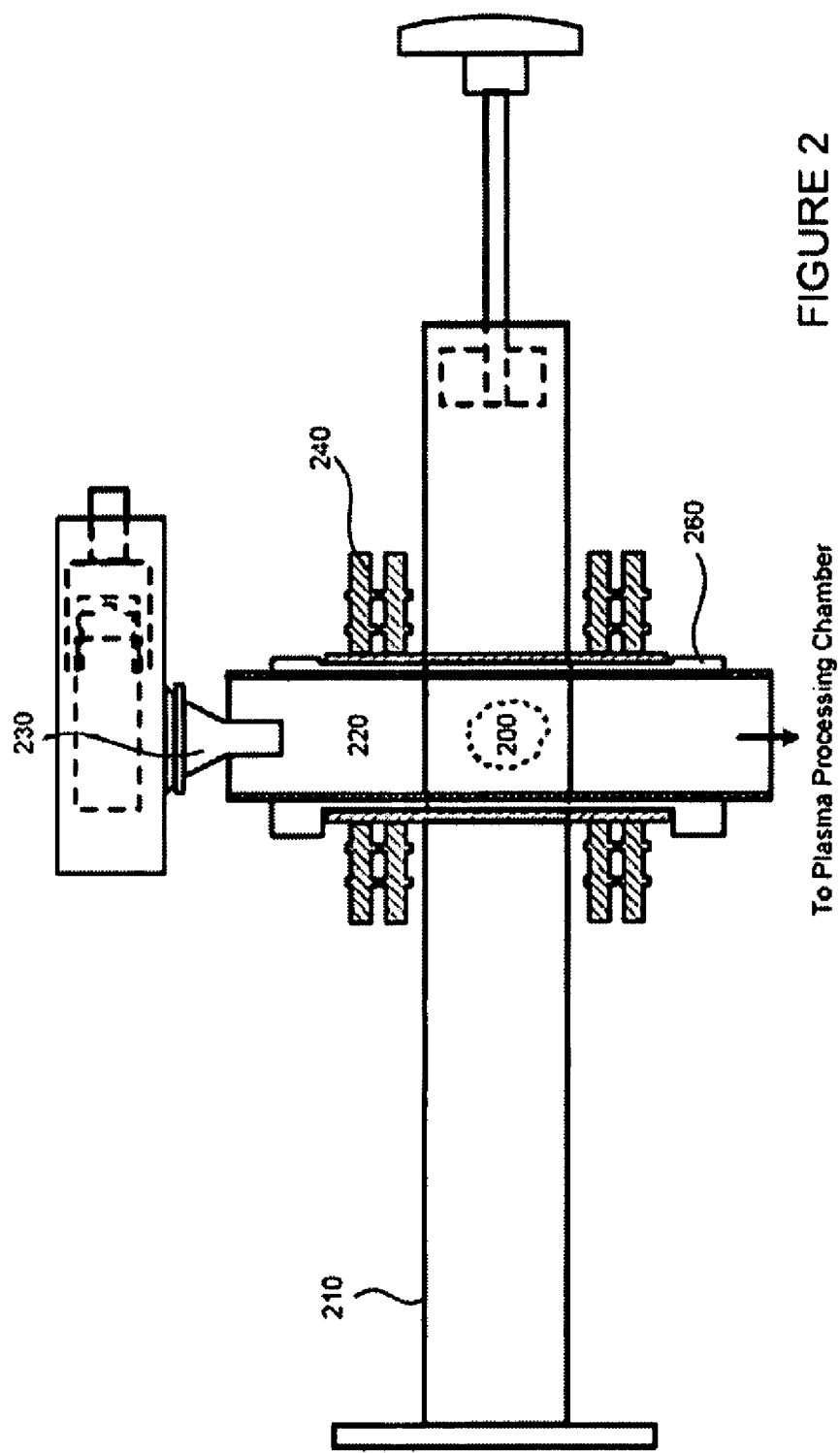
FIG. 2 shows, in an embodiment, a cross-section of a plasma generation arrangement.

FIG. 2 shows, in an embodiment, a cross-sectional view of a plasma generation arrangement. The plasma generation arrangement may include a microwave waveguide assembly 210, which may be capable of delivering microwave power to a plasma tube assembly 220. Plasma generation arrangement may also include a gas distribution assembly 230, which may inject one or more gases into plasma tube assembly 220. Within plasma tube assembly 220, microwave power may couple with one or more gases, such as $O_2$, $N_2$, $N_2H_2$, $HeH_2$, water vapor, and fluorinated compounds, to generate plasma 200. Further, plasma generation arrangement may include a plurality of plasma traps 240 to substantially reduce microwave radiation leakage that may occur. In addition, plasma generation arrangement may include a cooling assembly 260 to reduce thermal loading that may occur due to excess power.

Figure 3:
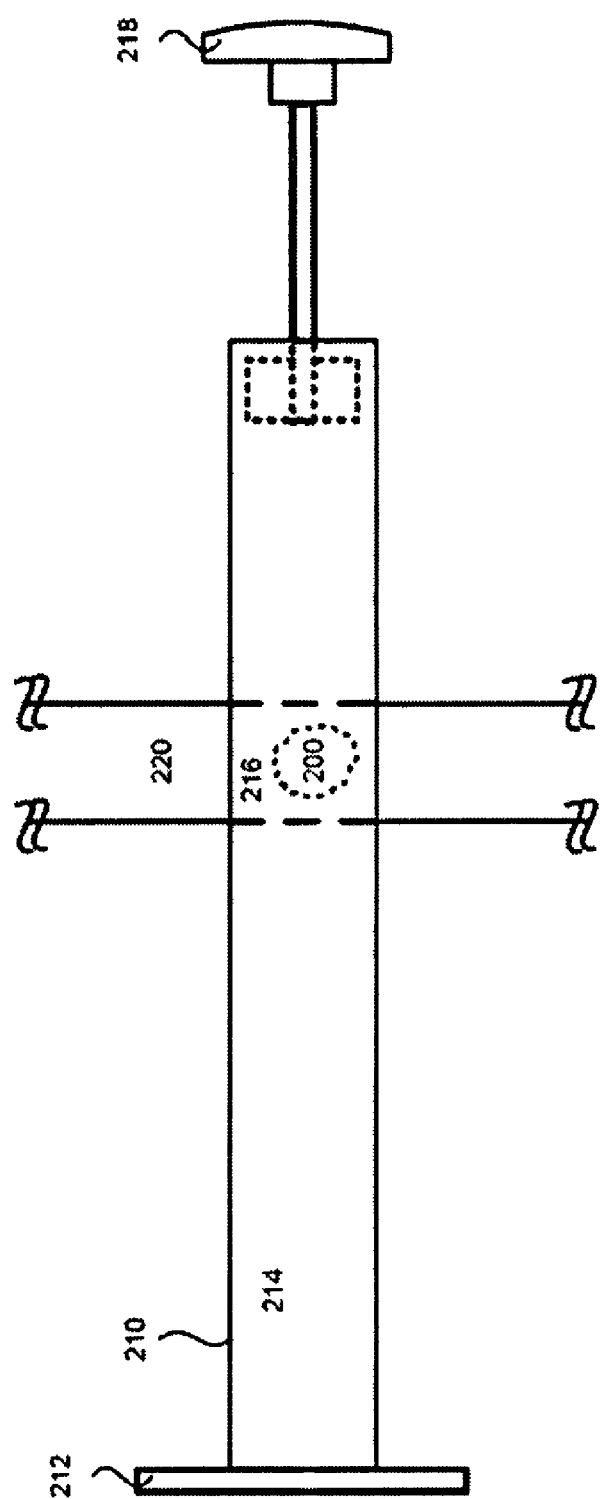
FIG. 3 shows, in an embodiment, a simple diagram of a microwave waveguide assembly.

FIG. 3 shows, in an embodiment, a simple diagram of microwave waveguide assembly 210, which may include a microwave power generator 212, such as Hitachi magnetron, and a waveguide 214. Microwave power generator 212 may send microwave power through waveguide 214 to a plasma-sustaining region 216 of plasma tube assembly 220. Microwave waveguide assembly 210, which may have a longitudinal axis parallel with a first axis, may intersect with plasma tube assembly 220, which may have a longitudinal axis parallel with a second axis that is substantially orthogonal with the first axis.

As discussed herein, a waveguide is a rectangular or cylindrical tube designed to direct microwave power. Waveguide 214 may extend across plasma-sustaining region 216 of plasma tube assembly 220. One end of waveguide 214 may include a sliding short 218. By manipulating sliding short 218, an operator may be able to adjust microwave power delivery within waveguide 214.

Figure 4:
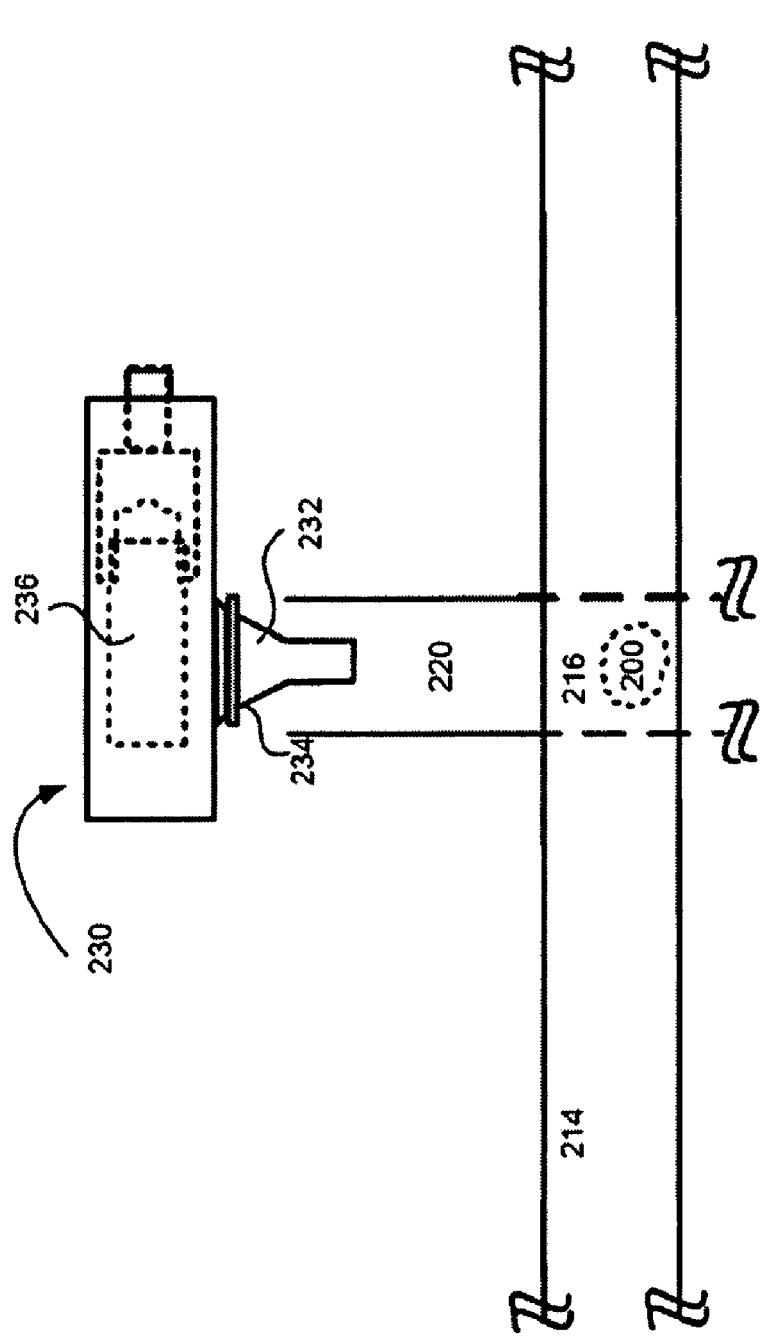
FIG. 4 shows, in an embodiment, a simple diagram of a gas distribution assembly.

FIG. 4 shows, in an embodiment, a simple diagram of gas distribution assembly 230. Gas distribution assembly 230 may include a gas distribution showerhead 232, which may introduce one or more gases into plasma-sustaining region 216 of plasma tube assembly 220. As noted above, microwave power may be coupled with gases to create plasma 200. Gas distribution showerhead 232 may further include an ultraviolet (UV) transparent window 234 with an igniter module 236. Igniter module 236 may be used to ignite plasma 200.

Figure 5:
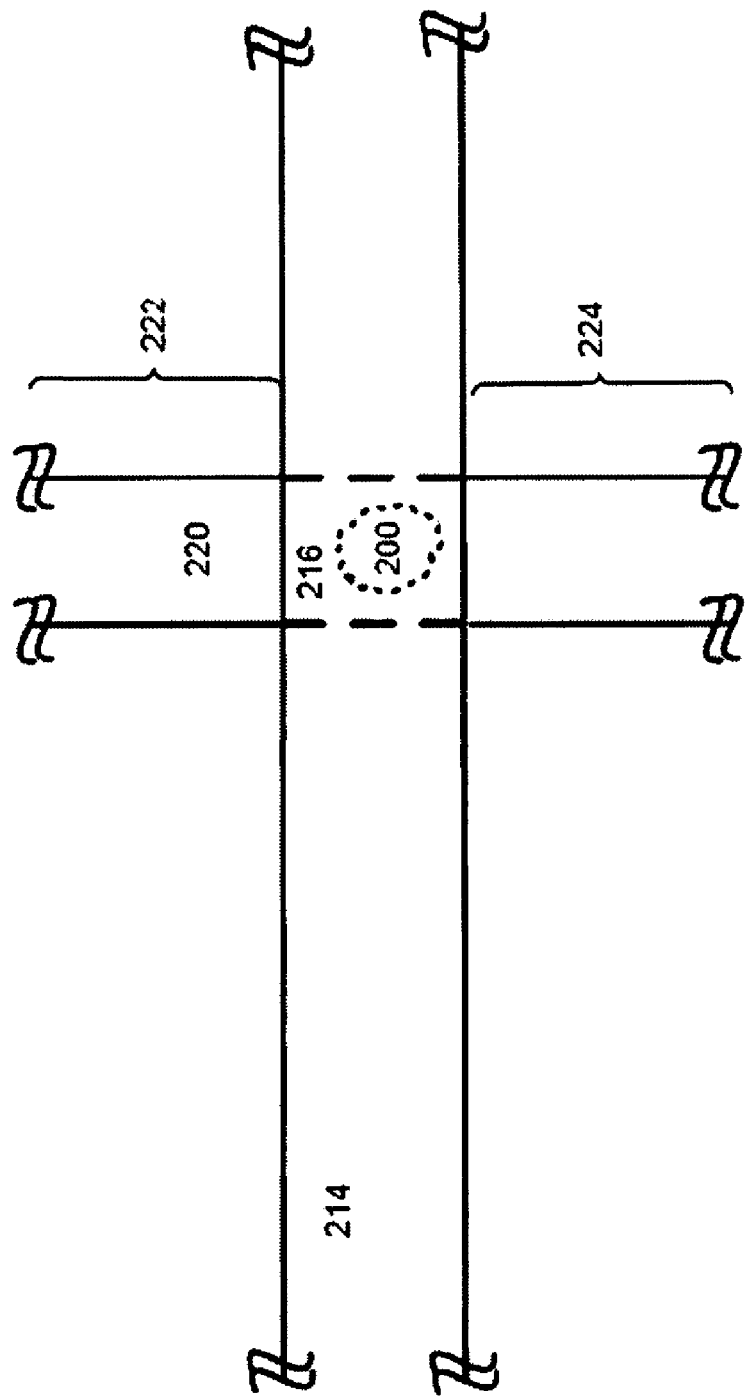
FIG. 5 shows, in an embodiment, a simple diagram of a plasma tube assembly coupled with a waveguide.

As noted above, microwave power and one or more gases may couple within plasma sustaining region 216 to generate plasma 200 that may be needed for substrate processing. FIG. 5 shows, in an embodiment, a simple diagram of plasma tube assembly 220 coupled with waveguide 214. Plasma tube assembly may be disposed substantially parallel with waveguide 214. Plasma tube 220 may be configured to allow plasma passage down to plasma processing chamber. Plasma tube assembly 220 may be a cylindrical structure that may be divided into three main sections: an upper section 222, a lower section 224, and plasma-sustaining region 216. As discussed herein, a plasma-sustaining region refers to a section of a plasma tube assembly that may be surrounded by a waveguide. Further, the plasma-sustaining region may be the area in which microwave power and one or more gases may couple to create plasma.

To provide a larger plasma-sustaining region, the geometry of plasma tube utilized has been altered. As noted above, prior art plasma tubes are generally configured having a diameter of about one inch in diameter. In an embodiment, the diameter of plasma tube assembly 220 may have a larger diameter than conventional tubes in the prior art.

In the prior art, generation of useful plasma species may reach a diminishing return at approximately 2300 watts due to the thermal loading that may occur in the plasma tube. For typical substrate processing using 3000 watts of microwave power at a frequency of 2450 MHz in a larger diameter configuration, plasma tube assembly 220 may provide for a larger volume in which plasma 200 may be generated. A larger volume may allow for less thermal loading, which in turn may result in a higher rate of absorbed microwave power to couple with one or more gases to generate plasma species. As discussed herein, plasma species may include both harmful and useful plasma species. Harmful plasma species may include, but are not limited to, UV photons and energetic species such as ions. Useful plasma species are usually neutral species such as radicals. Whereas harmful plasma species can damage a substrate and/or a process chamber, useful plasma species are needed to perform strip and/or non-critical etch on a substrate.

In another embodiment, plasma tube assembly 220 may be configured with a low profile in order to decrease wall surface area. With a smaller wall surface area, useful plasma species may have fewer opportunities to contact plasma tube assembly wall. Thus, one skilled in the art is aware that recombination rate may be reduced and the number of useful plasma species delivered to plasma processing chamber for substrate processing may be increased. The length of plasma tube assembly 220 may be determined by several factors including, but not limited to, the size of waveguide 214, the profile of plurality of plasma traps 240 (see FIG. 2), and the profile of cooling assembly 260 (see FIG. 2).

The size/shape of waveguide 214 may vary depend on microwave wavelength utilized and the mode for which the waveguide has been selected. In typical substrate processing, a microwave power generator employed may be capable of producing 3000 watts of microwave power at 2450 MHz. To support this amount of microwave power and minimize thermal loading, waveguide 214 may be a rectangular waveguide with a transverse electric sub 10 ($TE_{10}$) mode, in an embodiment.

Another factor that may contribute to the shortened length of plasma tube assembly 220 may be the profile of plurality of plasma traps 240 as noted above. As discussed herein, plasma traps may be hollow and/or solid centered electrically conductive disks, which may surround a plasma tube assembly. Plasma traps are generally useful to direct microwave power and prevent microwave leakage. By preventing microwave leakage, plasma traps may prevent the extension of plasma beyond a waveguide enclosure resulting in less chance of harmful plasma species being created near the plasma processing chamber.

Figure 6:
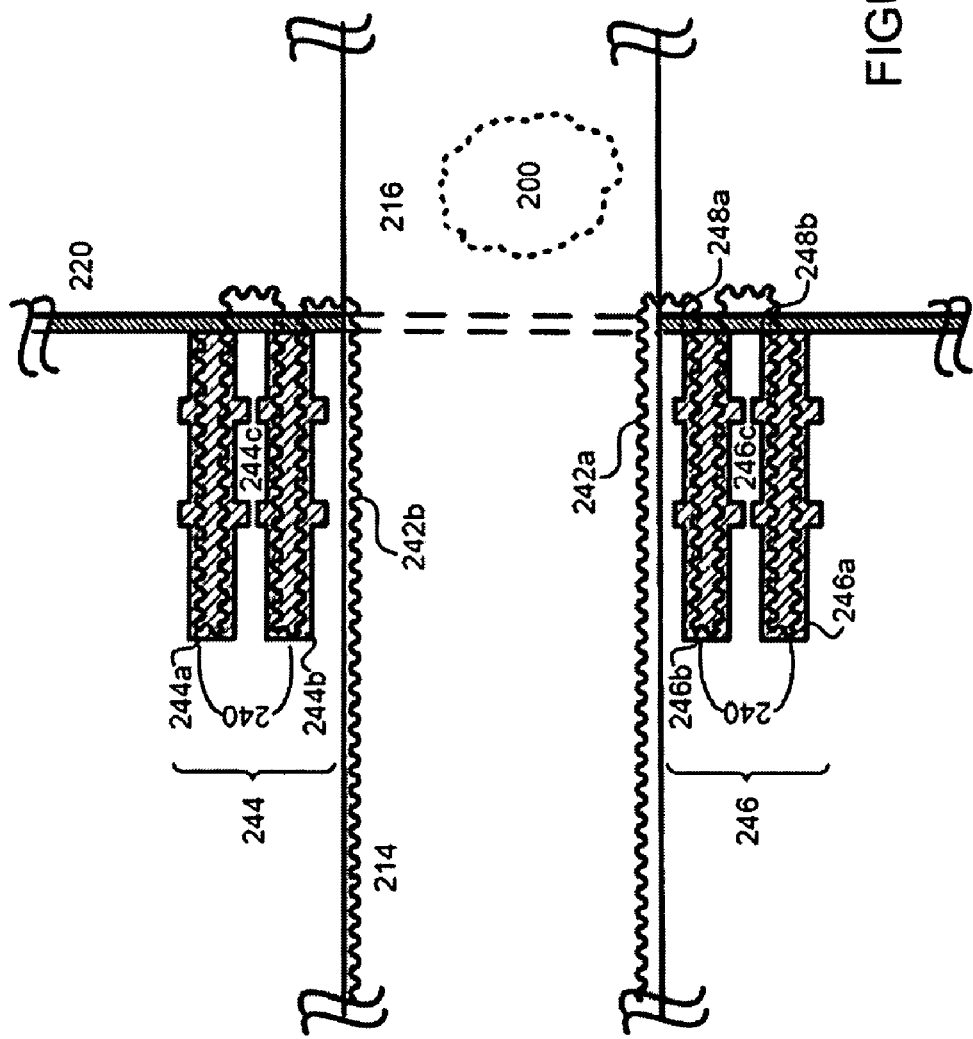
FIG. 6 shows, in an embodiment, a simple diagram of a plurality of plasma traps.

FIG. 6 shows, in an embodiment, a simple diagram of plurality of plasma traps. Plurality of plasma traps 240 may include one or more plasma traps. Plurality of plasma traps 240 may substantially eliminate microwave leakage, especially in process conditions that may include a large number of operational parameters. In an embodiment, plurality of plasma traps 240 may include two sets of plurality of plasma traps, an upstream set of plasma traps 244 and a downstream set of plasma traps 246.

In an embodiment, upstream set of plasma traps 244 may include an upstream outer plasma trap 244a and an upstream inner plasma trap 244b. Upstream inner plasma trap 244b may be disposed above waveguide 214. Upstream outer plasma trap 244a may be disposed above upstream inner plasma trap 244b to form a hollow or solid center disk-shape interstitial region 244c. In an embodiment, the interstitial region may be an air gap or may be filled with a material other than air, such as a solid material.

Similarly, downstream set of plasma traps 246 may include a downstream outer plasma trap 246a and a downstream inner plasma trap 246b. Downstream inner plasma trap 246b may be disposed below waveguide 214 and downstream outer plasma trap 246a may be disposed below downstream inner plasma trap 246b. Between downstream inner plasma trap 246b and downstream outer plasma trap 246a may be a hollow or solid center disk-shape interstitial region 246c, which may be an air gap or may be filled with a material other than air, such as a solid material.

Figure 7:
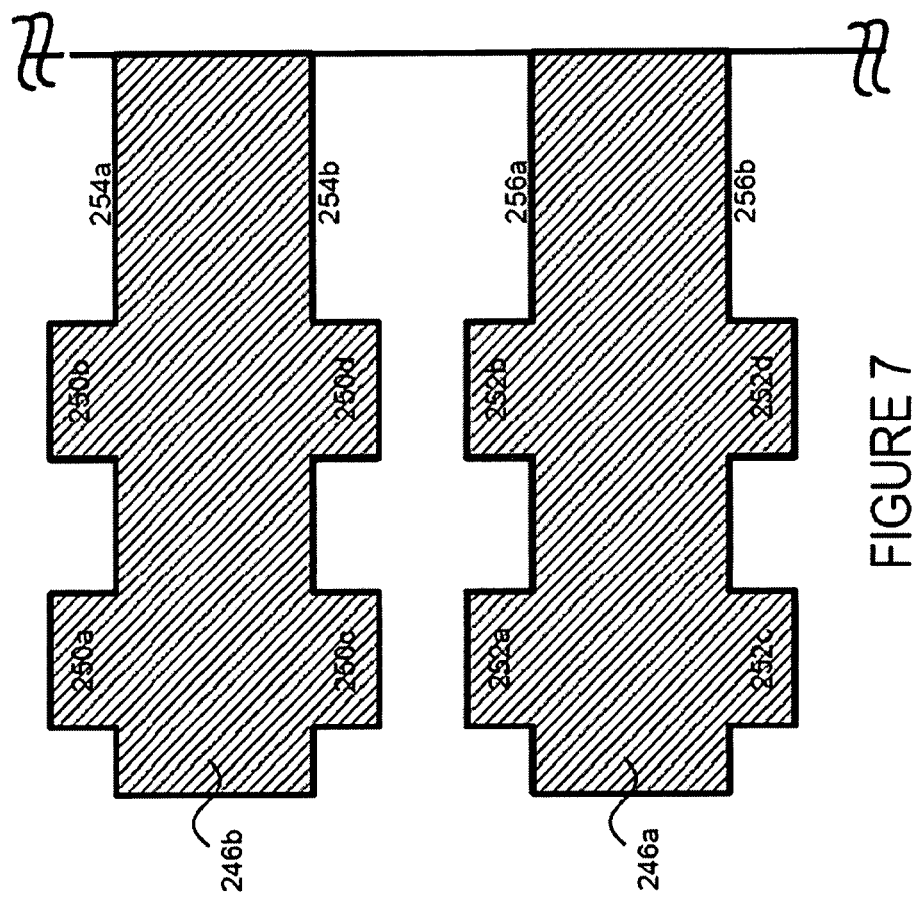
FIG. 7 shows, in an embodiment, plasma traps with corrugated surfaces and peaks.

In an embodiment, the surface of each plasma trap (244a, 244b, 246a, and 246b) may have corrugated surfaces with corrugated peaks as shown in FIG. 7. In an example, downstream inner plasma trap 246b may have an upstream corrugated surface 254a and a downstream corrugated surface 254b. On each corrugated surface may be a plurality of corrugated peaks (250a, 250b, 250c, and 250d). Similarly, downstream outer plasma trap 246a may have an upstream corrugated surface 256a and a downstream corrugated surface 256b. On each surface may be a plurality of corrugated peaks (252a, 252b, 252c, and 252d).

Even though only two plasma traps have been described for each set of plurality of plasma traps, each set may include any number of plasma traps. The plurality of plasma traps additionally, within each set, may be disposed similarly to the plurality of plasma traps described above. Also, each set of plurality of plasma traps may include different number of plasma traps. In an example, the upstream set of plasma traps may have two plasma traps while the downstream set of plasma traps may have three plasma traps to decrease the risk of microwave radiation leakage.

Figure 8:
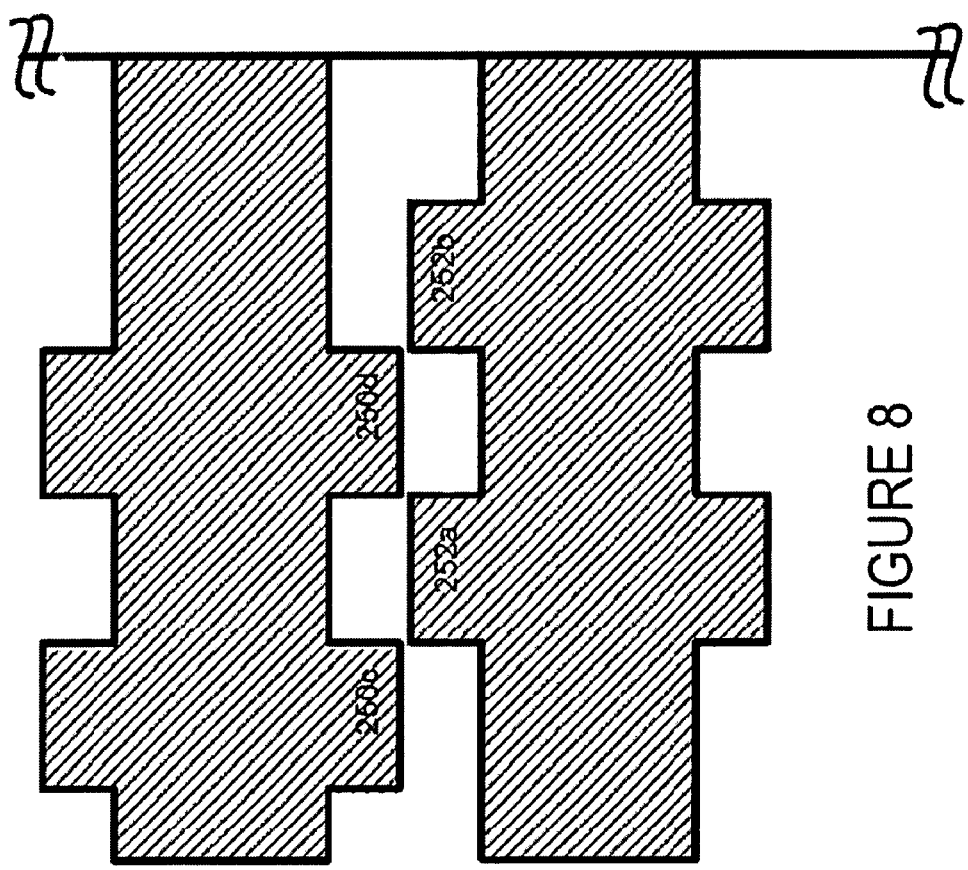
FIG. 8 shows, in an embodiment, how corrugated peaks of plasma traps may be offset.

FIG. 8 shows, in an embodiment, how the corrugated peaks may be offset. In an example, corrugated peaks 250c and 250d may be offset relative to corrugated peaks 252a and 252b. By offsetting the corrugated peaks, hollow or solid center disk-shape interstitial regions between each of the plasma traps may be minimized, thereby the length of the plasma tube assembly may be reduced.

As mentioned above, profile of the plurality of plasma traps may contribute to the profile of the plasma tube assembly. Although low profiles traps may be desired, the plurality of plasma traps must be large enough to prevent microwave leakage and to contain harmful plasma species. Those skilled in the art are aware that traps having a width of approximately a quarter of the wavelength of the microwave power may be able to maximize the voltage and minimize the current at the points of escape, thus, preventing or limiting microwave radiation leakage. In an embodiment, plurality of plasma traps may be corrugated, which may effectively reduce the electrical length of microwave power similar to that of a prior art single trap with dielectric material. Embodiment of the invention may further provide for corrugated plurality of plasma traps to be low profile and still remain effective.

Referring back to FIG. 6, microwave power tends to travel along the length of the waveguide (paths 242a and 242b). Consider the situation wherein, for example, microwave power has been introduced into waveguide 214. Microwave power may travel along path 242a to reach a point 248a where waveguide 214 and downstream inner plasma trap 246b may meet. At point 248a, impedance may be very high and current may be very low. In an example, if impedance is as high as infinite then current may be zero. Thus, microwave power may be effectively contained within the plurality of plasma trap and no microwave leakage may occur.

However, if microwave leakage does occur, then the microwave power may travel along the length of downstream inner plasma trap 246b to reach a corner 248b, which may also have very high impedance and very low current. Hence, any microwave leakage may be effectively contained within downstream outer plasma trap 246a. Similarly, upstream plurality of plasma traps 244 may capture microwave leakage that may travel along path 242b.

Figure 9:
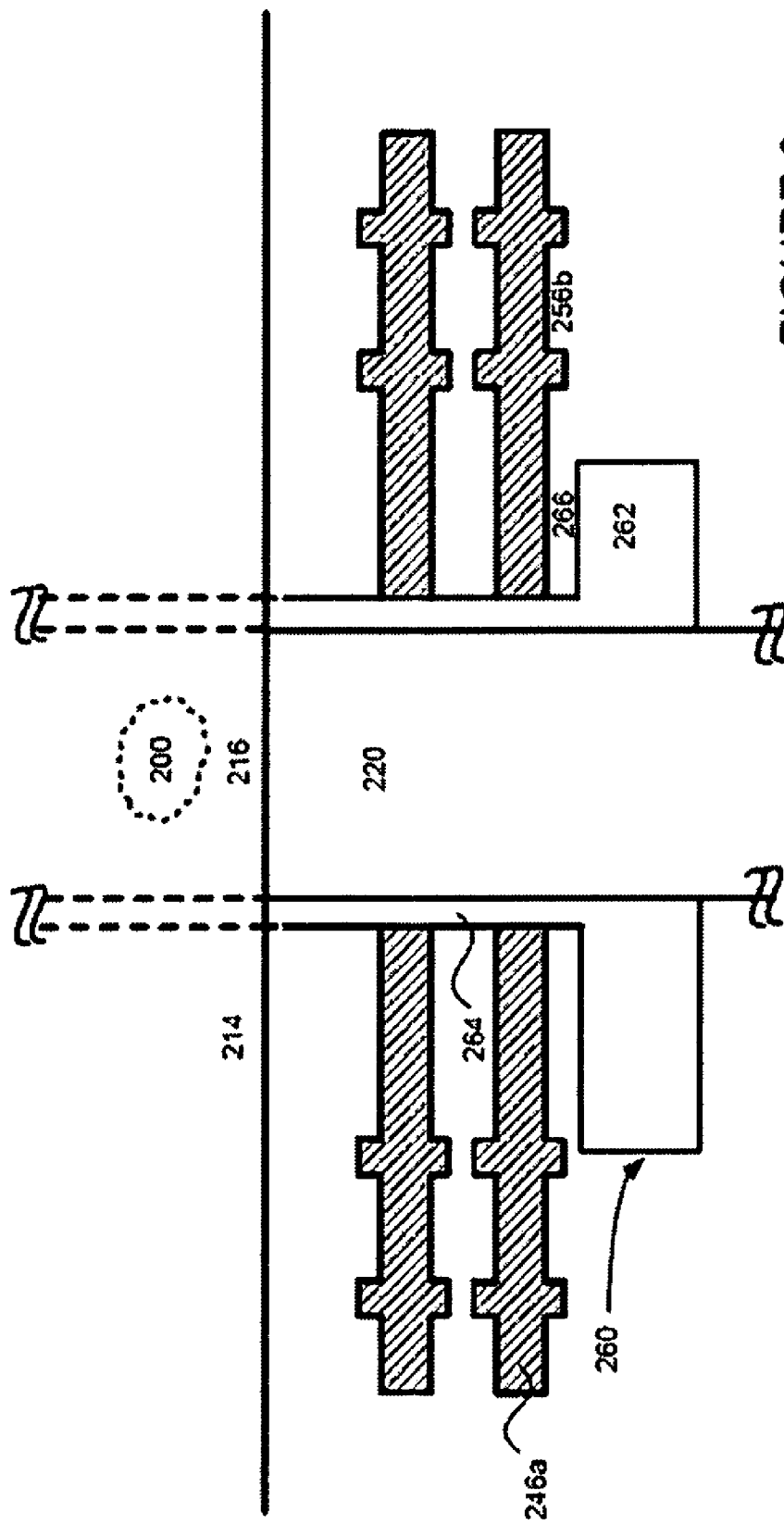
FIG. 9 shows, in an embodiment, a simple diagram of a cooling assembly.

A third factor that may affect the profile of a plasma tube assembly may be the size of a cooling assembly. FIG. 9 shows, in an embodiment, a simple diagram of cooling assembly 260. Cooling assembly 260 may include a cooling manifold 262 and a hollow cooling jacket 264. Coolant (i.e., heat-exchange fluid) may flow through cooling manifold 262 and up cooling jacket 264 to reduce thermal loading which in turn may reduce the recombination rate of plasma species.

To shorten the length of plasma tube assembly 220, the height of cooling manifold 262 may be reduced. However, cooling manifold 262 may still have to be large enough to effectively decrease thermal loading. In an embodiment, cooling manifold 262 may be located in close proximity to downstream outer plasma trap 246a. In an example, an upstream-facing surface 266 of downstream cooling manifold 262 may be adjacent to downstream-facing surface 256b of downstream outer plasma trap 246a. Unlike the prior art, there may be little or no air gap between downstream cooling manifold 262 and downstream outer plasma trap 246a, thereby, reducing the length of plasma tube assembly 220. Similarly, the same assembly may exist for an upstream cooling manifold in that the downstream-facing surface of an upstream cooling manifold may be adjacent (i.e. substantially no air gap) to an upstream-facing surface of an upstream outer plasma trap.

A coolant (e.g., Fluorinert FC-3283), which may be a microwave transparent fluid, may flow through cooling manifold 262 and up coolant jacket 264. Cooling jacket 264 may be a substantially cylindrical device that may surround plasma tube assembly 220. The coolant flowing through cooling jacket 264 may interact with plasma tube assembly 220 to facilitate heat transfer and effectively reduce the thermal loading that may occur, especially in plasma-sustaining region 216.

Over time, coolant may cause cooling assembly to deteriorate. In an embodiment, cooling assembly 260 may be made up of ceramic since ceramic may react less with the coolant than other materials. Further, since ceramic is opaque to the light spectra emitted by plasma 200, ceramic may block some of the radiation and may prevent damage to other components of the downstream microwave plasma system.

As can be appreciated from embodiments of the invention, the low profile plasma generation arrangement effectively reduces cost by generating more useful plasma species with the amount of microwave power typically employed in normal substrate processing. Thus, a highly efficient downstream microwave plasma system is created to provide for a more cost efficient isotropic substrate processing.

While this invention has been described in terms of several embodiments, there are alterations, permutations, and equivalents, which fall within the scope of this invention. It should also be noted that there are many alternative ways of implementing the methods and apparatuses of the present invention. It is therefore intended that the following appended claims be interpreted as including all such alterations, permutations, and equivalents as fall within the true spirit and scope of the present invention.

What is claimed is:

1. A plasma system comprising:
a microwave waveguide assembly; and
a plasma tube assembly intersecting said microwave waveguide assembly, said plasma tube assembly having a plasma-sustaining region defined by an upstream plurality of plasma traps and a downstream plurality of plasma traps,
wherein a first plasma trap among at least one of said upstream plurality of plasma traps and said downstream plurality of plasma traps includes a first downstream corrugated outer surface and a first upstream corrugated outer surface disposed at an opposite side to said first downstream corrugated outer surface, said first plasma trap further including a first plurality of corrugated peaks protruding, in a first direction parallel to said plasma tube assembly, outward from said first downstream corrugated outer surface thereby forming said first downstream corrugated outer surface, said first plasma trap further including a second plurality of corrugated peaks protruding, in a second direction parallel to said plasma tube assembly and said first plurality of corrugated peaks, outward from said first upstream corrugated outer surface thereby forming said first upstream corrugated outer surface, and
a second plasma trap among at least one of said upstream plurality of plasma traps and said downstream plurality of plasma traps includes a second upstream corrugated outer surface and a second downstream corrugated outer surface disposed at an opposite side to said second upstream outer surface, said second plasma trap further including a third plurality of corrugated peaks protruding, in said first direction parallel to said plasma tube assembly, outward from said second downstream corrugated outer surface thereby forming said second downstream corrugated outer surface, said second plasma trap further including a fourth plurality of corrugated peaks protruding, in said second direction parallel to said plasma tube assembly and said third plurality of corrugated peaks, outward from said second upstream corrugated outer surface thereby forming said second upstream corrugated outer surface, said second upstream corrugated outer surface facing said first downstream corrugated outer surface.

2. The plasma system of claim 1 wherein said first plurality of corrugated peaks includes at least a first corrugated peak and a second corrugated peak, said first corrugated peak surrounding said plasma tube assembly, said second corrugated peak surrounding said first corrugated peak.

3. The plasma system of claim 1 wherein said downstream plurality of plasma traps includes at least a downstream outer plasma trap and a downstream inner plasma trap, said downstream outer plasma trap being disposed downstream relative to said downstream inner plasma trap.

4. The plasma system of claim 3 further including a downstream cooling manifold, said downstream cooling manifold being disposed in at least one of a first assembly arrangement and a second assembly arrangement relative to said downstream outer plasma trap, said first assembly arrangement being characterized by having substantially no air gap between an upstream-facing surface of said downstream cooling manifold and a downstream-facing surface of said downstream outer plasma trap, said second assembly arrangement being characterized by said downstream cooling manifold being disposed adjacent to said downstream outer plasma trap.

5. The plasma system of claim 4 wherein said downstream cooling manifold is disposed in said first assembly arrangement relative to said downstream outer plasma trap.

6. The plasma system of claim 4 wherein said downstream cooling manifold is disposed in said second assembly arrangement relative to said downstream outer plasma trap.

7. The plasma system of claim 3 wherein said downstream outer plasma trap is formed of a first hollow center electrically conductive disk surrounding a passage within said plasma tube assembly, wherein a second hollow center electrically conductive disk is disposed upstream of said first hollow center electrically conductive disk, said second hollow center electrically conductive disk also surrounding said passage within said plasma tube assembly, and a first interstitial region is disposed between said first hollow center electrically conductive disc and said second hollow center electrically conductive disc.

8. The plasma system of claim 7 wherein said first interstitial region forms an air gap.

9. The plasma system of claim 7 wherein said first interstitial region is formed of a solid material other than air.

10. The plasma system of claim 7 wherein said downstream inner plasma trap is formed of said second hollow center electrically conductive disk, wherein a third hollow center electrically conductive disk is disposed upstream relative to said second hollow center electrically conductive disk, and a second interstitial region is disposed between said second hollow center electrically conductive disc and said third hollow center electrically conductive disc.

11. The plasma system of claim 10 wherein said second interstitial region forms an air gap.

12. The plasma system of claim 10 wherein said second interstitial region is formed of a solid material other than air.

13. The plasma system of claim 3 wherein said downstream outer plasma trap is formed of a first solid center electrically conductive disk surrounding a passage within said plasma tube assembly, wherein a second solid center electrically conductive disk is disposed upstream of said first solid center electrically conductive disk, said second solid center electrically conductive disk also surrounding said passage within said plasma tube assembly, and a first interstitial region is disposed between said first solid center electrically conductive disc and said second solid center electrically conductive disc.

14. The plasma system of claim 13 wherein said first interstitial region forms an air gap.

15. The plasma system of claim 13 wherein said first interstitial region is formed of a solid material other than air.

16. The plasma system of claim 13 wherein said downstream inner plasma trap is formed of said second solid center electrically conductive disk, wherein a third solid center electrically conductive disk is disposed upstream relative to said second solid center electrically conductive disk, and a second interstitial region is disposed between said second solid center electrically conductive disc and said third solid center electrically conductive disc.

17. The plasma system of claim 16 wherein said second interstitial region forms an air gap.

18. The plasma system of claim 16 wherein said second interstitial region is formed of a solid material other than air.

19. The plasma system of claim 3 further including an upstream cooling manifold, said upstream cooling manifold being disposed such that there exists substantially no air gap between a downstream-facing surface of said upstream cooling manifold and an upstream-facing surface of an upstream outer plasma trap among said upstream plurality of plasma traps.

20. The plasma system of claim 3 further including an upstream cooling manifold, said upstream cooling manifold being disposed adjacent to an upstream outer plasma trap among said upstream plurality of plasma traps.

21. The plasma system of claim 1 wherein said microwave guide assembly includes a sliding short configured for tuning said microwave guide assembly.

22. A plasma system comprising:
a microwave waveguide assembly; and
a plasma tube assembly intersecting said microwave waveguide assembly, said plasma tube assembly having a plasma-sustaining region defined by an upstream plasma trap set and downstream plasma trap set disposed downstream relative to said upstream plasma trap set,
wherein a first plasma trap among at least one of said upstream plasma trap set and said downstream plasma trap set includes a first plurality of corrugated peaks protruding, in a first direction parallel to said plasma tube assembly, outward from an outer surface of said first plasma trap thereby forming said outer surface of said first plasma trap, and
a second plasma trap among at least one of said upstream plasma trap set and said downstream plasma trap set includes a second plurality of corrugated peaks protruding, in a second direction parallel to said plasma tube assembly, outward from an outer surface of said second plasma trap thereby forming said outer surface of said second plasma trap, said second plurality of corrugated peaks being aligned with said first plurality of corrugated peaks, said outer surface of said first plasma trap facing said outer surface of said second plasma trap,
said first plasma trap further including a third plurality of corrugated peaks protruding, in said second direction parallel to said plasma tube assembly and said first plurality of corrugated peaks, outward from said outer surface of said first plasma trap thereby forming said outer surface of said first plasma trap, and
said second plasma trap further including a fourth plurality of corrugated peaks protruding, in said first direction parallel to said plasma tube assembly and said second plurality of corrugated peaks, outward from said outer surface of said second plasma trap thereby forming said outer surface of said second plasma trap.

23. The plasma system of claim 22 further comprising a downstream cooling manifold disposed such that substantially no air gap exists between an upstream-facing surface of said downstream cooling manifold and a downstream-facing surface of said downstream plasma trap set.

24. The plasma system of claim 22 wherein said first plurality of corrugated peaks includes at least a first corrugated peak and a second corrugated peak, said first corrugated peak surrounding said plasma tube assembly, said second corrugated peak surrounding said first corrugated peak.

25. The plasma system of claim 22 wherein said downstream plasma trap set includes at least a downstream outer plasma trap and a downstream inner plasma trap, said downstream outer plasma trap being disposed downstream relative to said downstream inner plasma trap, wherein said downstream outer plasma trap is formed of a first hollow center electrically conductive disk surrounding a passage within said plasma tube assembly, and wherein a second hollow center electrically conductive disk is disposed upstream of said first hollow center electrically conductive disk, said second hollow center electrically conductive disk also surrounding said passage within said plasma tube assembly, and a first interstitial region is disposed between said first hollow center electrically conductive disc and said second hollow center electrically conductive disc.

26. The plasma system of claim 25 wherein said first interstitial region forms an air gap.

27. The plasma system of claim 25 wherein said first interstitial region is formed of a solid material other than air.

28. The plasma system of claim 25 wherein said downstream inner plasma trap is formed of said second hollow center electrically conductive disk, wherein a third hollow center electrically conductive disk is disposed upstream relative to said second hollow center electrically conductive disk, and a second interstitial region is disposed between said second hollow center electrically conductive disc and said third hollow center electrically conductive disc.

29. The plasma system of claim 28 wherein said second interstitial region forms an air gap.

30. The plasma system of claim 28 wherein said second interstitial region is formed of a solid material other than air.

31. The plasma system of claim 22 wherein said microwave guide assembly includes a sliding short configured for tuning said microwave guide assembly.

32. The plasma system of claim 22 wherein a downstream outer plasma trap among said downstream plasma trap set is formed of a first solid center electrically conductive disk surrounding a passage within said plasma tube assembly, wherein a second solid center electrically conductive disk is disposed upstream of said first solid center electrically conductive disk, said second solid center electrically conductive disk also surrounding said passage within said plasma tube assembly, and a first interstitial region is disposed between said first solid center electrically conductive disc and said second solid center electrically conductive disc.

33. The plasma system of claim 32 wherein said first interstitial region forms an air gap.

34. The plasma system of claim 32 wherein said first interstitial region is formed of a solid material other than air.

35. The plasma system of claim 32 wherein said downstream inner plasma trap is formed of said second solid center electrically conductive disk, wherein a third solid center electrically conductive disk is disposed upstream relative to said second solid center electrically conductive disk, and a second interstitial region is disposed between said second solid center electrically conductive disc and said third solid center electrically conductive disc.

36. The plasma system of claim 35 wherein said second interstitial region forms an air gap.

37. The plasma system of claim 35 wherein said second interstitial region is formed of a solid material other than air.

38. A plasma system comprising:
a microwave waveguide assembly; and
a plasma tube assembly intersecting said microwave waveguide assembly, said plasma tube assembly having a plasma-sustaining region defined by an upstream plurality of plasma traps and a downstream plurality of plasma traps,
wherein a first plasma trap among at least one of said upstream plurality of plasma traps and said downstream plurality of plasma traps includes a first plurality of corrugated peaks protruding, in a first direction parallel to said plasma tube assembly, outward from an outer surface of said first plasma trap thereby forming said outer surface of said first plasma trap,
a second plasma trap among at least one of said upstream plurality of plasma traps and downstream plurality of plasma traps includes a second plurality of corrugated peaks protruding, in a second direction parallel to said plasma tube assembly, outward from an outer surface of said second plasma trap thereby forming said outer surface of said second plasma trap, said second plurality of corrugated peaks being offset relative to said first plurality of corrugated peaks, said outer surface of said first plasma trap facing said outer surface of said second plasma trap,
said first plasma trap further including a third plurality of corrugated peaks protruding, in said second direction parallel to said plasma tube assembly and said first plurality of corrugated peaks, outward from said outer surface of said first plasma trap thereby forming said outer surface of said first plasma trap, and
said second plasma trap further including a fourth plurality of corrugated peaks protruding, in said first direction parallel to said plasma tube assembly and said second plurality of corrugated peaks, outward from said outer surface of said second plasma trap thereby forming said outer surface of said second plasma trap.

39. The plasma system of claim 38 further comprising a downstream cooling manifold disposed such that substantially no air gap exists between an upstream-facing surface of said downstream cooling manifold and a downstream-facing surface of a downstream outer plasma trap among said downstream plurality of plasma traps.

40. The plasma system of claim 38 wherein said first plurality of corrugated peaks includes at least a first corrugated peak and a second corrugated peak, said first corrugated peak surrounding said plasma tube assembly, said second corrugated peak surrounding said first corrugated peak.

41. The plasma system of claim 38 wherein a downstream outer plasma trap among said downstream plurality of plasma traps is formed of a first hollow center electrically conductive disk surrounding a passage within said plasma tube assembly, wherein a second hollow center electrically conductive disk is disposed upstream of said first hollow center electrically conductive disk, said second hollow center electrically conductive disk also surrounding said passage within said plasma tube assembly, and a first interstitial region is disposed between said first hollow center electrically conductive disc and said second hollow center electrically conductive disc.

42. The plasma system of claim 41 wherein said first interstitial region forms a first air gap.

43. The plasma system of claim 41 wherein said first interstitial region forms a first solid structure.

44. The plasma system of claim 41 wherein a downstream inner plasma trap among said downstream plurality of plasma traps is formed of said second hollow center electrically conductive disk, wherein a third hollow center electrically conductive disk is disposed upstream relative to said second hollow center electrically conductive disk, and a second interstitial region is disposed between said second hollow center electrically conductive disc and said third hollow center electrically conductive disc.

45. The plasma system of claim 44 wherein said second interstitial region forms a second air gap.

46. The plasma system of claim 44 wherein said second interstitial region forms a second solid structure.

47. The plasma system of claim 38 wherein a downstream outer plasma trap among said downstream plurality of plasma traps is formed of a first solid center electrically conductive disk surrounding a passage within said plasma tube assembly, wherein a second solid center electrically conductive disk is disposed upstream of said first solid center electrically conductive disk, said second solid center electrically conductive disk also surrounding said passage within said plasma tube assembly, and a first interstitial region is disposed between said first solid center electrically conductive disc and said second solid center electrically conductive disc.

48. The plasma system of claim 47 wherein said first interstitial region forms a first air gap.

49. The plasma system of claim 47 wherein said first interstitial region forms a first solid structure.

50. The plasma system of claim 47 wherein a downstream inner plasma trap among said downstream plurality of plasma traps is formed of said second solid center electrically conductive disk, wherein a third solid center electrically conductive disk is disposed upstream relative to said second solid center electrically conductive disk, and a second interstitial region is disposed between said second solid center electrically conductive disc and said third solid center electrically conductive disc.

51. The plasma system of claim 50 wherein said second interstitial region forms a second air gap.

52. The plasma system of claim 50 wherein said second interstitial region forms a second solid structure.

* * * * *